(12) United States Patent
Kim et al.

(10) Patent No.: US 11,329,456 B2
(45) Date of Patent: May 10, 2022

(54) IONIC WIND GENERATOR AND ELECTRONIC DEVICE HAVING HEAT DISSIPATION FUNCTION USING SAME

(71) Applicant: LG ELECTRONICS INC., Seoul (KR)

(72) Inventors: BongJun Kim, Seoul (KR); Jae Hyun Oh, Seoul (KR); Changhee Lee, Seoul (KR); MinWoo Jeong, Seoul (KR); Minjae Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/941,967

(22) Filed: Jul. 29, 2020

(65) Prior Publication Data

US 2021/0091542 A1  Mar. 25, 2021

(30) Foreign Application Priority Data

Sep. 23, 2019 (KR) .................. 10-2019-0116511

(51) Int. Cl.
*H01T 23/00* (2006.01)
*H05K 7/20* (2006.01)

(52) U.S. Cl.
CPC ......... *H01T 23/00* (2013.01); *H05K 7/20136* (2013.01)

(58) Field of Classification Search
CPC ..... H01T 23/00; H01T 19/04; H05K 7/20136; H05K 7/20172; H05K 7/20145
USPC ........................................................ 361/229
See application file for complete search history.

(56) References Cited

U.S. PATENT DOCUMENTS

2012/0002342 A1*  1/2012  Lee .................. F28F 27/02
                                                361/231

FOREIGN PATENT DOCUMENTS

| CN | 1489249 | 4/2004 |
| CN | 203756558 | 8/2014 |
| JP | 2008-112714 | 5/2008 |
| KR | 10-1512936 | 4/2015 |
| KR | 10-1513402 | 4/2015 |
| WO | WO 96/04703 | 2/1996 |

OTHER PUBLICATIONS

Wakamatsu Toshio; ION wind generator; Date: May 15, 2008;; entire specification and drawings; (Year: 2008).*
European Search Report dated Jan. 27, 2021 issued in Application No. 20191526.1.

* cited by examiner

*Primary Examiner* — Dharti H Patel
(74) *Attorney, Agent, or Firm* — KED & Associates LLP

(57) ABSTRACT

An ionic wind generator and an electronic device having a heat dissipation function using the same are proposed. The ionic wind generator includes a power module; a first electrode configured to receive power from the power module by being connected to the power module to become an emitter electrode; and a second electrode spaced apart from the first electrode and grounded and at the same time connected to the power module to become a counter electrode. In addition, the first electrode is configured as a carbon brush including multiple carbon fibers. Accordingly, in the ionic wind generator, the emitter electrode is configured as the carbon brush having multiple carbon fibers.

19 Claims, 12 Drawing Sheets

IONIC WIND GENERATOR AND ELECTRONIC DEVICE HAVING HEAT DISSIPATION FUNCTION USING SAME

CROSS REFERENCE TO RELATED APPLICATION

The present application claims priority to Korean Patent Application No. 10-2019-0116511, filed Sep. 23, 2019, the entire contents of which is incorporated herein for all purposes by this reference.

BACKGROUND OF THE INVENTION

Field of the Invention

The present disclosure generally relates to an ionic wind generator and an electronic device having a heat dissipation function using the same. More particularly, the present disclosure relates to an electronic device having a heat dissipation function capable of decreasing the temperature of a heating element by using an ionic wind.

Description of the Related Art

In recent years, with the trend of miniaturization of electronic equipment, the integration density of an electronic device is increasing, and accordingly, heat generated from the electronic equipment is increased. When the heat is not sufficiently dissipated to the outside, the performance and lifespan of the electronic equipment may be lowered and the deformation caused by the heat may cause the breakdown of the electronic equipment.

In particular, in recent years, communication equipment is installed in various products such as home appliances or automobiles. Such communication equipment generates a large amount of heat, so cooling functions have become important factors for product life and performance.

However, due to product miniaturization, it is difficult to install a high-performance cooling means such as a heat dissipation fan inside an electronic device. To solve this problem, a heat dissipation means using an ionic wind has recently been developed. The ionic wind is generated after ionizing air by applying a high voltage to an emitter electrode such as a probe or a thin wire to cause a corona discharge. When the ionic wind is moved by a strong electric field, the ambient air moves together with the ionic wind. As for the cooling technology using the ionic wind, an ionic wind generator is installed to be adjacent to a heat sink. Accordingly, technologies for cooling the heat sink using the ionic wind are disclosed.

In an ionic wind generator, a wire-type electrode or a needle-type electrode is used as an ionization electrode (the emitter electrode) that causes a corona discharge. Since a high voltage is applied to the ionization electrode, a wire-type electrode has a risk of breakage during use, and a needle-type electrode is prone to deterioration due to abrasion of a tip thereof during use.

In addition, the ionic wind generator has a low wind speed compared to a heat dissipation fan, so it is difficult to perform sufficient cooling function. However, the wind speed can be increased by making a distance between the ionization electrode and a counter electrode close. However, narrowing the distance between the ionization electrode and the counter electrode also increases the amount of ozone generated, adversely affecting the surrounding environment. Of course, in order to prevent such adverse effects by ozone, it is possible to lower the applied voltage or install a separate filter, but this method has a disadvantage of lowering the wind speed or increasing the number of parts.

DOCUMENTS OF RELATED ART (Patent Document 1) Korean Patent No. 10-1512936
(Patent Document 2) Korean Patent No. 10-1513402

SUMMARY OF THE INVENTION

Accordingly, the present disclosure has been made keeping in mind the above problems occurring in the related art, and an objective of the present disclosure is intended to increase the life of an emitter electrode and the speed of an ionic wind by using a carbon brush as the emitter electrode (an ionization electrode).

Another objective of the present disclosure is to increase the speed and volume of the ionic wind via the carbon brush and to obtain sufficient cooling performance without using a heat sink, thereby miniaturizing an ionic wind generator.

Still another objective of the present disclosure is to increase the speed and volume of the ionic wind, but to reduce the amount of ozone generated as a by-product during generation of the ionic wind.

In order to achieve the above object, according to one aspect of the present disclosure, there is provided an ionic wind generator including: a power module; a first electrode configured to receive power from the power module by being connected to the power module to become an emitter electrode; and a second electrode spaced apart from the first electrode and grounded at the same time of being connected to the power module to become a counter electrode. The first electrode is configured as a carbon brush including multiple carbon fibers. Accordingly, in the ionic wind generator of the present disclosure, the emitter electrode is configured as the carbon brush having multiple carbon fibers, thereby providing a larger ionization amount than the wire electrode or the needle electrode, and a faster ionic wind speed than the wire electrode or the needle electrode when the carbon brush and the wire electrode or the needle electrode have the same diameters.

A first end of the first electrode may face the second electrode such that a distance between the first electrode and the second electrode is the shortest. When the carbon brush which is the first electrode is provided at a position close to the second electrode which is the ground electrode, a sufficiently high ionic wind speed may be obtained, so a sufficient cooling performance may be obtained even without using a heat sink, and the miniaturization of the ionic wind generator may be realized.

The first electrode may be mounted to a mounting arm part provided at the entrance of a module housing, wherein when the first electrode is mounted to the mounting arm part, a first end of the first electrode may face the second electrode and a second end of the first electrode positioned at an opposite side of the first end may face the outside of the installation space. In this case, the first electrode may be movably mounted to the mounting arm part, so a relative distance between the first end of the first electrode and the second electrode may be changed. Accordingly, the speed of the ionic wind may be easily adjusted according to installation environment or products to which the ionic wind generator is applied, and when the carbon brush wears out, the carbon brush may be moved outwards to restore performance thereof, which extends the life of the ionic wind generator.

The first electrode may be multiply provided in directions parallel to each other. The multiple first electrodes increase the volume of the ionic wind and the cooling performance of components may be improved by using the ionic wind generator.

In addition, when a voltage applied to the first electrode by the power module is 4 kV to 7 kV, the distance between the first electrode and the second electrode may be 3 mm to 5 mm. Such a condition may increase the speed of the ionic wind generated between the first and second electrodes. In the present disclosure, the first electrode may be configured as the carbon brush, so the amount of ozone generated may be limited compared to the existing wire electrode.

According to another aspect of the present disclosure, the electronic device including: the heating element provided in a casing; and the ionic wind generator provided in the casing to be adjacent to the heating element and causing an ionic wind to flow to an inner space in which the heating element is installed. In addition, the ionic wind generator includes: the first electrode configured to receive power from the power module and to be the carbon brush including multiple carbon fibers; and the second electrode spaced apart from the first electrode and grounded at the same time of being connected to the power module to become the counter electrode. Accordingly, the first electrode of the present disclosure may be configured as the carbon brush and have lower breakage and wear rates than the existing wire electrode or needle electrode, so the durability of the ionic wind generator may be improved.

In addition, the ionic wind generator may include: the module housing having an installation space therein; the first electrode provided at an entrance of the installation space; and the second electrode provided at an exit of the installation space, wherein the ionic wind generated by the first electrode may flow in a direction of the exit of the installation space from the entrance thereof. Accordingly, the ionic wind generator of the present disclosure may be made in a shape of a module including the first electrode and the second electrode. Accordingly, the ionic wind generator may be easily installed at the entrance of the casing.

In addition, the ionic wind generator may be provided to be adjacent to an inlet open at one side of the casing, and an outlet may be open at a position corresponding to an opposite side of the inlet relative to the heating element in the casing. That is, to improve cooling performance, only the inlet and outlet may be required to be made in the casing. Accordingly, the present disclosure may be applied without significantly changing a conventional electronics design.

Furthermore, a heat dissipation window may be open at least one side of an upper part and a lower part of the casing, wherein the heat sink of a flat plate shape may be installed in the heat dissipation window to be parallel to the circuit board. Such a heat sink may further increase the cooling performance.

The ionic wind generator and the electronic device having a heat dissipation function using the same of the present disclosure described above have the following effects.

In the ionic wind generator of the present disclosure, the emitter electrode is configured as the carbon brush having multiple carbon fibers, thereby providing a larger ionization amount than the wire electrode or the needle electrode, and a faster ionic wind speed than the wire electrode or the needle electrode when the carbon brush and the wire electrode or the needle electrode have the same diameters. Accordingly, the cooling performance of components is significantly improved by using the ionic wind generator.

Particularly, the carbon brush also improves the durability of the ionic wind generator since the breakage rate and wear rate of the carbon brush are lower than the breakage rate and wear rate of the existing wire electrode or needle electrode.

In addition, when the carbon brush which is the first electrode is provided at a position close to the second electrode which is the ground electrode, a sufficiently high ionic wind speed can be obtained, so a sufficient cooling performance can be obtained even without using a heat sink, and the miniaturization of the ionic wind generator is realized. Accordingly, the cooling performance can be enhanced inside the electronic device which has high thermal resistance but is very narrow and thus the heat dissipation design is very difficult, or even in an environment of poor heat dissipation effect since the heating element is required to be covered by a shield can.

Of course, when a relative distance between the first electrode and the second electrode is short, an ozone generation amount increases. However, the first electrode of the present disclosure is configured as the carbon brush, so the ozone generation amount is significantly reduced compared to the existing wire electrode. Accordingly, the present disclosure enables the implementation of the environmentally friendly ionic wind generator.

In addition, in the present disclosure, the relative distance between the first electrode and the second electrode is controlled by moving the carbon brush, which is the first electrode. Accordingly, the speed of the ionic wind can be easily adjusted according to installation environment or products to which the ionic wind generator is applied, and when the carbon brush wears, the carbon brush is moved outwards to restore performance thereof, which greatly extends the life of the ionic wind generator.

In addition, the ionic wind generator of the present disclosure is made in the shape of a module including the first electrode and the second electrode. Accordingly, the ionic wind generator can be easily installed at the entrance of the casing. Further, improvement in the cooling performance may be realized by adding only the inlet and outlet to the casing. Therefore, the present disclosure can be applied without significantly changing a conventional electronic device design, thereby having a high degree of compatibility and design freedom.

Furthermore, in the present disclosure, the ionic wind generated by the first electrode (the carbon brush) and the second electrode (the counter electrode) cools the heating element, resulting in no noise and vibration compared to generation of an ionic wind by using a motorized cooling fan. Accordingly, the present disclosure can be applied to various electronic devices requiring low noise/vibration.

BRIEF DESCRIPTION OF THE DRAWINGS

The above and other objects, features and other advantages of the present disclosure will be more clearly understood from the following detailed description when taken in conjunction with the accompanying drawings, in which.

DETAILED DESCRIPTION OF THE INVENTION

Figure 1:
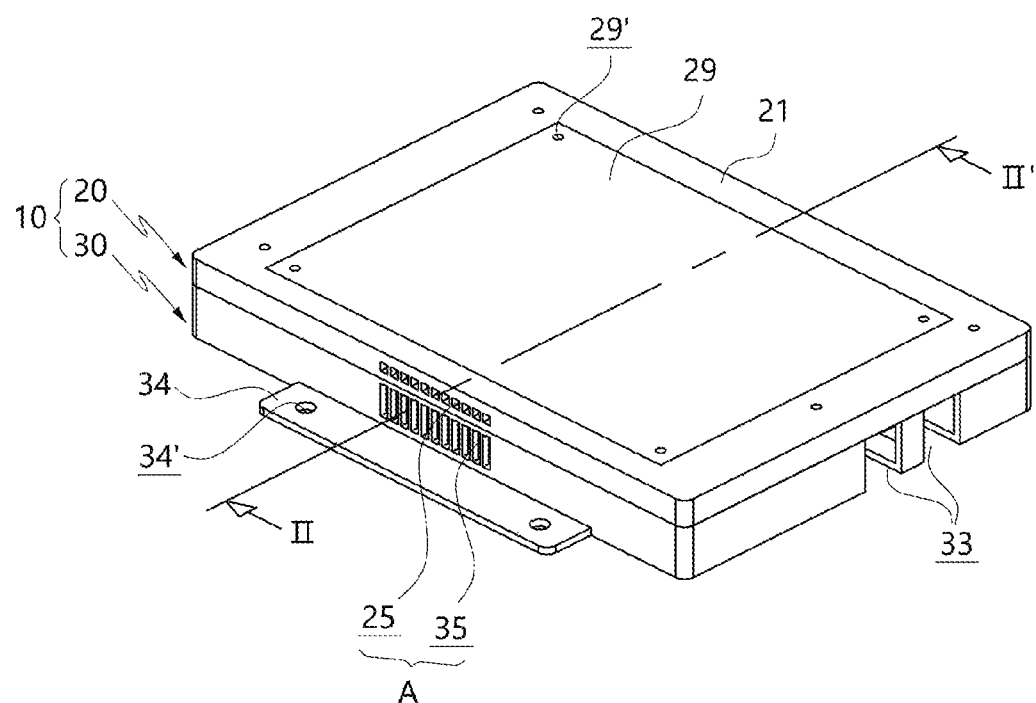
FIG. 1 is a perspective view illustrating an embodiment of an electronic device having a heat dissipation function according to the present disclosure.

Hereinbelow, some embodiments of present disclosure will be described in detail with reference to the accompanying drawings. In adding reference numerals to the components of each drawing, it should be noted that the same reference numerals are assigned to the same components as much as possible even though they are shown in different drawings. In addition, in describing the embodiments of the present disclosure, detailed descriptions of related known configurations or functions are omitted when it is determined that the understanding of the embodiments of the present disclosure is disturbed.

In addition, in describing the components of the embodiments of the present disclosure, terms such as first, second, A, B, a, and b may be used. These terms are only to distinguish the components from other components, and the nature or order, etc. of the components is not limited by the terms. When a component is described as being "connected", "coupled", or "joined" to other components, that component may be directly connected or joined to the other components, and it will be understood that other components between each component may be "connected", "coupled", or "joined" to each other.

The present disclosure relates to an ionic wind generator and an electronic device having a heat dissipation function using the same. The present disclosure may be applied to a structure poor in heat dissipation because of being installed in narrow space although having a heating element 45 generating much heat such that the structure implements high heat dissipation performance. To this end, the electronic device of the present disclosure generates an ionic wind by using the ionic wind generator 50, and has the structure of increasing the speed of the ionic wind and the life of the ionic wind generator.

Here, the ionic wind uses movements of ions occurring during corona discharge. The ions generated by the discharge electrode are moved from an emitter electrode (a discharge electrode) to a collector electrode (a ground electrode) by an electric field between the electrodes, that is, by coulomb force. The ions moving in this manner move air molecules in the same direction via the collision with the air molecules, and the movements of the air molecules are joined together and are finally used as a blowing force.

Hereinbelow, the specific structure of the present disclosure will be described by focusing on the ionic wind generator 50 generating the ionic wind and the electronic device including the ionic wind generator 50.

Figure 2:
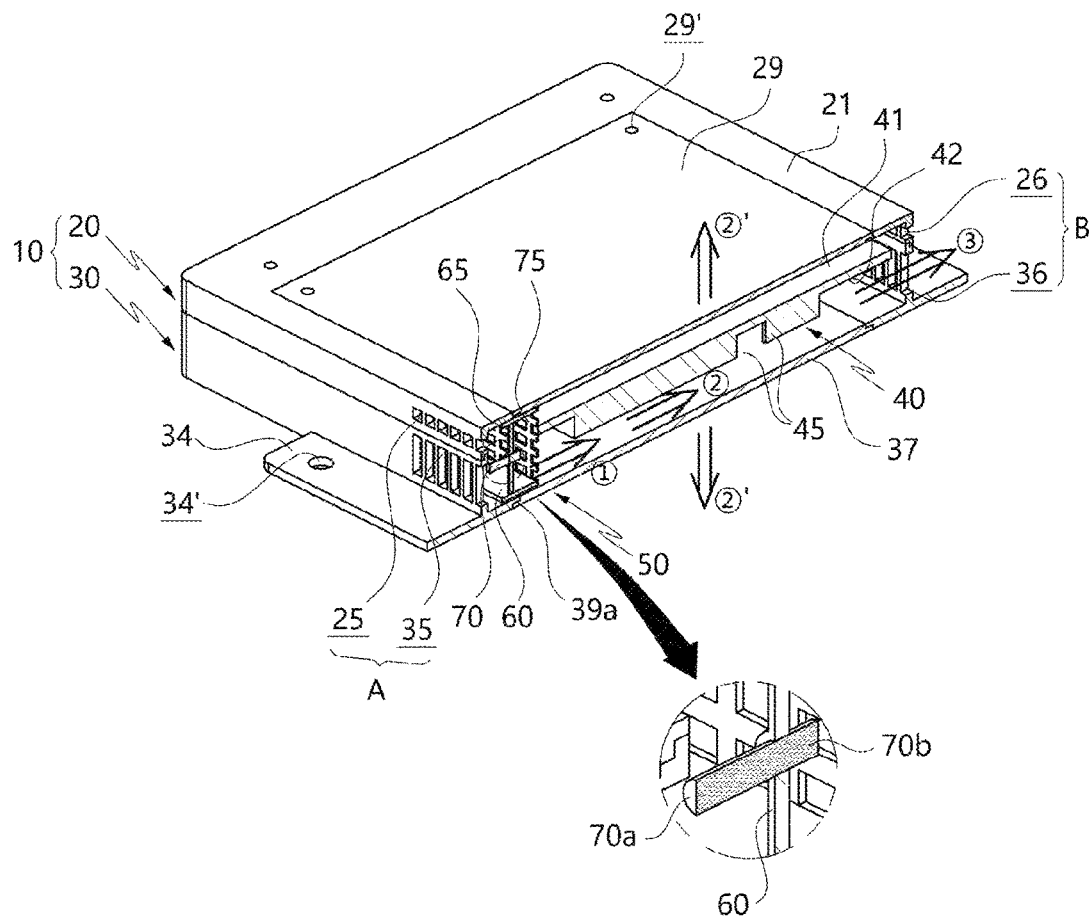
FIG. 2 is a sectional view taken along line II-II' of FIG. 1.

FIG. 1 is a perspective view illustrating an embodiment of the electronic device having a heat dissipation function according to the present disclosure, and FIG. 2 illustrates a sectional view taken along line II-II' of FIG. 1. FIGS. 1 and 2 illustrate the entire structure of the electronic device performing a heat dissipation function, in which the ionic wind generator 50 is provided according to the present disclosure.

As illustrated in FIGS. 1 and 2, a casing 10 constitutes an outer surface and framework of the electronic device. The casing 10 may be made of a metal or nonmetallic material, and has an empty inner space therein. A circuit board 40 and the ionic wind generator 50, which will be described hereinbelow, are provided in the inner space. In the embodiment, the casing 10 has a closed shape, but may have an open shape in a portion thereof.

The casing 10 includes a lower casing 30 and an upper casing 20. When the lower casing 30 is assembled with the upper casing 20, the inner space is defined therebetween. In the embodiment, each of the lower casing 30 and the upper casing 20 has a roughly rectangular shape, but the shape thereof may be changed variously. The casing 10 is made to be thin with a height of a size smaller than a size of a left to right width, so the height of the inner space is also low. Accordingly, the inner space of the casing 10 is in a condition in which temperature therein is easily increased when heat generated by the heating element 45 is not dissipated.

Figure 4:
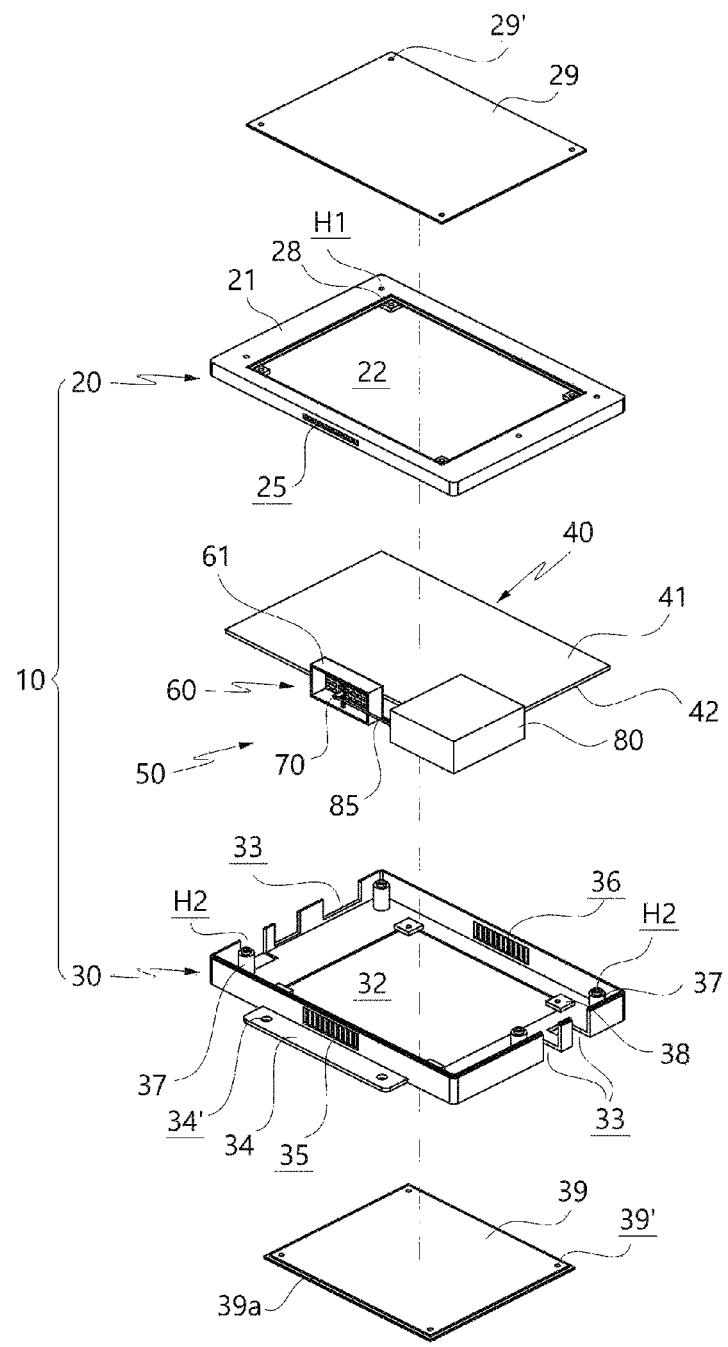
FIG. 4 is an exploded perspective view of components according to the embodiment illustrated in FIG. 1.

Referring to FIG. 4, a heat dissipation window 22 is open in an upper surface 21 of the upper casing 20. The heat dissipation window 22 is a part communicating an inner space of the upper casing with the outside by opening a portion of the upper casing 20 and has an approximately rectangular shape in the embodiment. A first heat sink 29, which will be described hereinbelow, is combined with the heat dissipation window 22 and shields the inner space. A reference numeral 28 refers to brackets, and each of the brackets protrudes from an edge of the heat dissipation window 22 such that the first heat sink 29 is assembled with the heat dissipation window 22.

An upper inlet 25 is provided in the upper casing 20. The upper inlet 25 is provided in a side surface of the upper casing 20 and is a part open to communicate the inner space of the upper casing with the outside. The upper inlet 25 may be made in various forms. In the embodiment, the upper inlet 25 is a kind of louver made in a shape of multiple slits. The upper inlet 25 defines one inlet A in cooperation with a lower inlet 35 of the lower casing 30, which will be described below.

Figure 5:
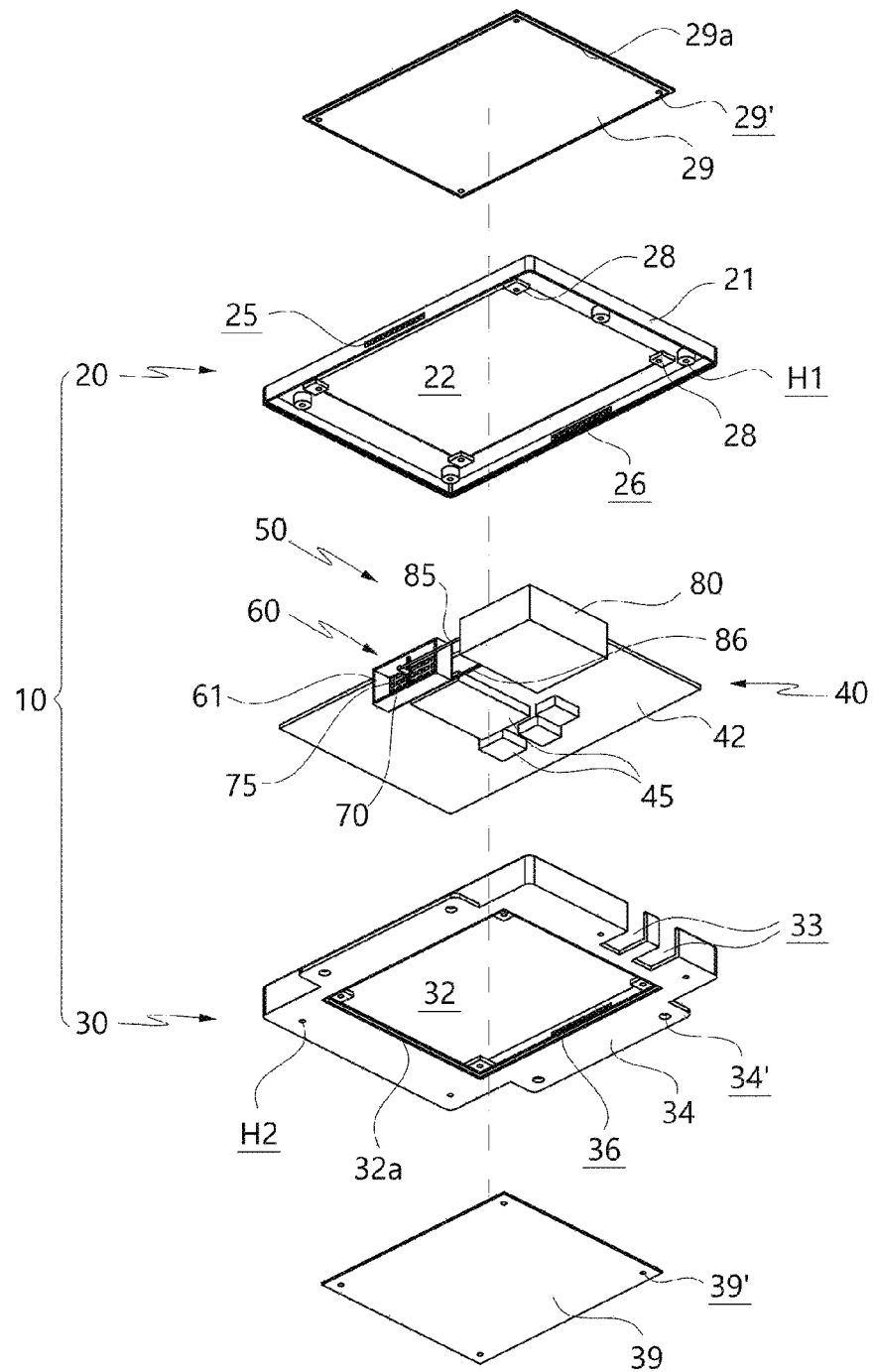
FIG. 5 is an exploded perspective view of the components seen from a different angle according to the embodiment illustrated in FIG. 1.

Referring to FIGS. 2 and 5, an upper outlet 26 is provided in the upper casing 20. Like the upper inlet 25, the upper outlet 26 is made on a side surface of the upper casing 20 and is a part open to communicate the inner space of the upper casing with the outside. Like the upper inlet 25, the upper outlet 26 may be shaped like a louver. The upper outlet 26 is made on the opposite side of the upper inlet 25 and is a passage allowing the introduced air to flow to the outside.

The upper outlet 26 defines one outlet B in cooperation with a lower outlet 36 of the lower casing 30, which will be described hereinbelow.

The first heat sink 29 is assembled with the upper casing 20. The first heat sink 29 is assembled at the heat dissipation window 22 of the upper casing 20 and functions to transfer heat of the inner space to the outside. To this end, the first heat sink 29 is made of a highly thermally conductive metal. The first heat sink 29 is heated due to heat generated by the circuit board 40 positioned thereunder and the heating element 45 mounted to the circuit board 40, but an upper surface of the first heat sink is exposed to the outside, so the heat dissipation function can be performed.

Fastening holes 29' are provided on edges of the first heat sink 29 to be assembled with the brackets 28 of the upper casing 20, and first step parts 29a are provided on edges of side surfaces of the first heat sink 29. The first step parts 29a are parts that are held in the edges of the heat dissipation window 22 and are continuously made by surrounding the edges of the first heat sink 29, but may be omitted.

The lower casing 30 facing the upper casing 20 is assembled with the upper casing 20. The lower casing 30 is assembled with the upper casing 20 to define one casing 10 and an inner space therein. The lower casing 30 corresponds to the upper casing 20 and has an approximately rectangular shape. Referring to the structure of the lower casing 30, an open heat dissipation window 32 is provided in a center of the lower casing 30 as in the upper casing 20. A second heat sink 39, which will be described hereinbelow, is assembled with the heat dissipation window 32. A reference numeral 38 refers to the brackets, and each of the brackets protrudes from an edge of the heat dissipation window 32 such that the second heat sink 39 is assembled with the heat dissipation window 32.

Referring to FIGS. 4 and 5, the lower casing 30 includes part assembly holes 33. Each of the part assembly holes 33 is an open part of a portion of a side surface of the lower casing 30, and a connector (not shown) may be exposed through the part assembly hole 33 and be assembled with an external component. The part assembly hole 33 may be provided multiply by surrounding the lower casing 30, and the shape, number, location thereof may be modified.

The lower casing 30 includes a mounting plate 34. The mounting plate 34 protrudes from the side surface of the lower casing 30 and allows the casing 10 to be fixed to a specific position. To this end, mounting holes 34' are provided in the mounting plate 34, and a fastener passes through each of the mounting holes 34' to secure the casing 10. The mounting plate 34 is provided in a pair on opposite sides of the lower casing 30.

The lower inlet 35 is provided in the lower casing 30. The lower inlet 35 is provided in a side surface of the lower casing 30 and is a part open to communicate the inner space of the lower casing with the outside. The lower inlet 35 may be made in various forms. In the embodiment, the lower inlet 35 is a kind of louver made in a shape of multiple slits. The lower inlet 35 defines the inlet A in cooperation with the upper inlet 25 of the upper casing 20 described above.

Referring to FIGS. 2 and 4, the lower outlet 36 is provided in the lower casing 30. Like the lower inlet 35, the lower outlet 36 is made on a side surface of the lower casing 30 and is a part open to communicate the inner space of the lower casing with the outside. The lower outlet 36 may be shaped like a louver like the lower inlet 35. The lower outlet 36 is made on the opposite side of the lower inlet 35, and is a passage allowing the introduced air to let out. The lower outlet 36 defines one outlet B in cooperation with the upper outlet 26 of the upper casing 20 described above.

Mounting bosses 37 protrude from the lower casing 30. Each of the mounting bosses 37 protrudes from a bottom surface of the lower casing 30 in a direction of the upper casing 20, and includes a second assembly hole H2 at a center thereof. The second assembly hole H2 corresponds to a first assembly hole H1 of the upper casing 20, and when a bolt-like fastener is fastened to the first assembly hole H1 and the second assembly hole H2 to pass therethrough with the upper casing 20 and the lower casing 30 assembled tentatively, the upper casing 20 and the lower casing 30 are completely assembled. Of course, alternatively, the assembly of the upper casing 20 and the lower casing 30 may be performed in various ways, such as by a forcible fitting manner or by using adhesive.

The second heat sink 39 is assembled with the lower casing 30. The second heat sink 39 is assembled with the heat dissipation window 32 of the lower casing 30 and functions to transfer heat of the inner space to the outside. To this end, the second heat sink 39 is made of a highly thermally conductive metal. The second heat sink 39 is heated due to heat generated by the circuit board 40 positioned at an upper side thereof and the heating element 45 mounted to the circuit board 40, but a lower surface of the second heat sink is exposed to the outside, so the heat dissipation function can be performed.

Fastening holes 39' are provided on edges of the second heat sink 39 to be assembled with the brackets 38 of the lower casing 30, and second step parts 39a are provided on edges of side surfaces of the second heat sink 39. The second step parts 39a are parts that are held in the edges of the heat dissipation window 32 and are made continuously by surrounding the edges of the second heat sink 39, but may be omitted.

In the embodiment, the first heat sink 29 and the second heat sink 39 are installed at an upper part and a lower part of the casing 10 respectively, but only any one of the first and second heat sinks may be installed, or all thereof may be omitted.

The circuit board 40 is provided in the inner space S of the casing 10. Various components may be mounted to the circuit board 40, and when the electronic device is a communication module, other components including antennas may be added therein or connected thereto. The heating element 45 is mounted to an upper surface 41 or a lower surface 42 of the circuit board 40, and although not shown, a shield may be provided to cover the heating element 45. Referring to FIGS. 2 and 5, the heating element 45 is mounted to the circuit board 40 and protrudes therefrom. The shield, which is not shown, may block electromagnetic waves as a shield can.

Here, the heating element 45 may be regarded to include the circuit board 40. Since the circuit board 40 itself may generate heat during the use of an electronic device, the circuit board 40 may also be a part of the heating element 45. Of course, only various electrical parts mounted to the circuit board 40 may be regarded as the heating element 45, and all of the circuit board 40 and the electrical parts may be regarded as the heating element 45. In the embodiment, the heating element 45 is mounted only to the lower surface 42 of the circuit board 40 but alternatively, may be mounted even to the upper surface 41.

The ionic wind generator 50 is installed at one side of the circuit board 40. The ionic wind generator 50 is mounted to the casing 10 or the circuit board 40 to be adjacent to the heating element 45 and functions to cause the ionic wind to flow to an inner space in which the heating element 45 is installed. The ionic wind generator 50 is mounted in the inlet A of the casing 10 and causes the ionic wind to flow to the inner space, and the ionic wind flows up to the circuit board 40. In the process, the heating element 45 can be cooled.

As described again hereinbelow, the ionic wind generator 50 includes a power module 80, a first electrode 70, and a second electrode 75. The first electrode 70 is configured to receive power from the power module 80 by being connected to the power module 80 and to become the emitter electrode, and the second electrode 75 is spaced apart from the first electrode 70 in a direction closer to the heating element 45 and is grounded at the same time of being connected to the power module 80 to become the collector electrode.

Figure 3:
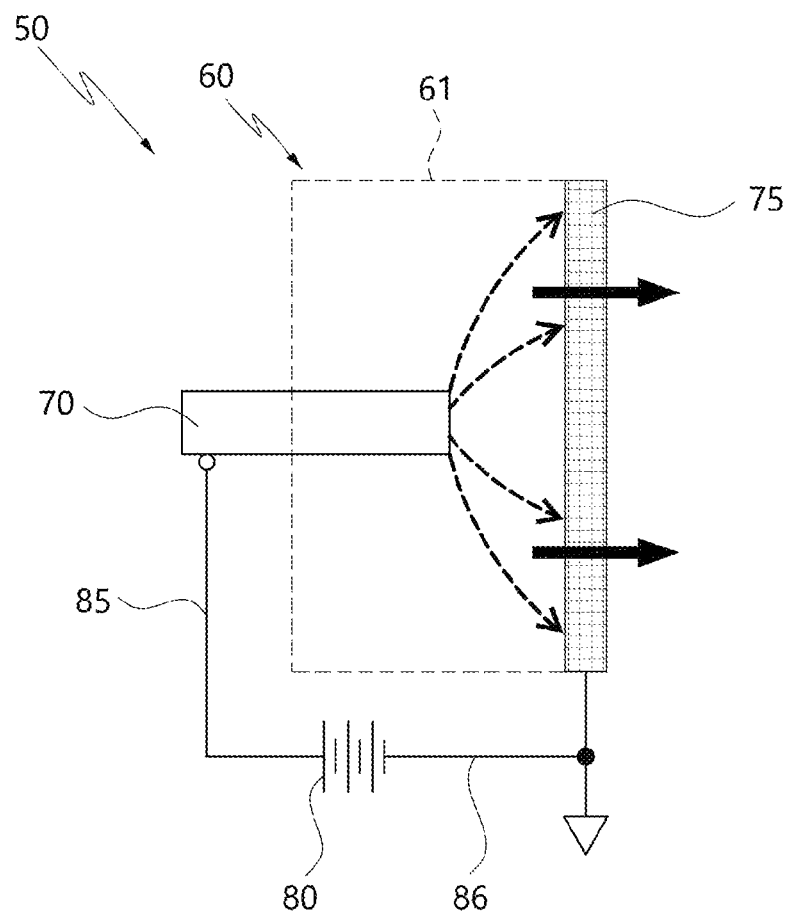
FIG. 3 is a conceptual diagram illustrating circuit configuration for generating an ionic wind by an ionic wind generator according to the embodiment illustrated in FIG. 1.

FIG. 3 illustrates a circuit configuration for generating the ionic wind. As illustrated in FIG. 3, the power module 80 generates a high voltage direct current and functions to receive external power and supply the power to the first electrode 70. In the embodiment, the power module 80 is installed at a side of the circuit board 40 and generates the voltage of 5 kv or more, and the magnitude of the voltage may change. For reference, in FIG. 3, a module housing 60 constituting the ionic wind generator 50 is indicated with a dotted line.

The first electrode 70 and the second electrode 75 are connected to the power module 80. In the embodiment, the first electrode 70 is connected to a positive electrode (+) of the power module 80, and the second electrode 75 is connected to a negative electrode (−) thereof. Furthermore, the second electrode 75 is grounded through the circuit board 40. Here, the two electrodes may be reversed and the first electrode 70 may be the negative electrode. However, when the first electrode 70 is the negative electrode, ozone generation concentration by corona discharge increases and efficiency is low. Accordingly, the first electrode is preferably the positive electrode. In this case, a connection wire 85 is provided between the power module 80 and the first electrode 70, and the power module 80 may be electrically connected to the first electrode 70. An end 85' of the connection wire 85 (see FIG. 7) is combined with and electrically connected to a second end 70a of the first electrode 70. In the present disclosure, the first electrode 70 is configured as a carbon brush, and such a configuration will be described again below.

In this connected state, when a high voltage direct current is applied to the first electrode 70 by the power module 80, the first electrode 70 becomes the emitter electrode and the second electrode 75 becomes the collector electrode, so that the ionic wind is generated. More particularly, ions generated in the first electrode 70 by corona discharge are moved from the emitter electrode (the first electrode 70) to the ground electrode (the second electrode 75) by an electric field between the electrodes, that is, by coulomb force. The ions moving in this manner move air molecules in the same direction via the collision with the air molecules, and the movements of the moving air molecules are joined together and finally generate a blowing force.

Accordingly, in the present disclosure, the first electrode 70, the second electrode 75, and the power module 80 constitute the ionic wind generator 50, wherein the ionic wind generator 50 generates the ionic wind and functions to cool the heating element 45 positioned in the second electrode 75. Accordingly, the ionic wind generator 50 of the present disclosure is installed at a side of the casing 10 and is implemented when the power module 80 is mounted to the circuit board 40, so the ionic wind generator can be applied to a conventional electronic device without significantly changing the design of the conventional electronic device.

Figure 6:
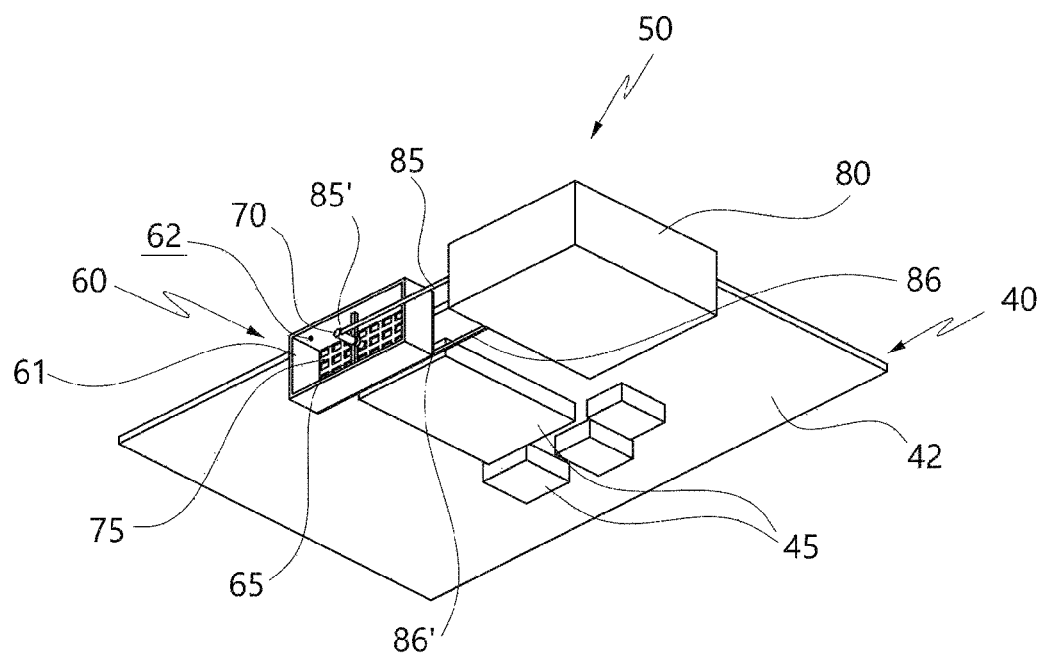
FIG. 6 is a perspective view illustrating configurations of the ionic wind generator and a circuit board according to the embodiment illustrated in FIG. 1.
Figure 7:
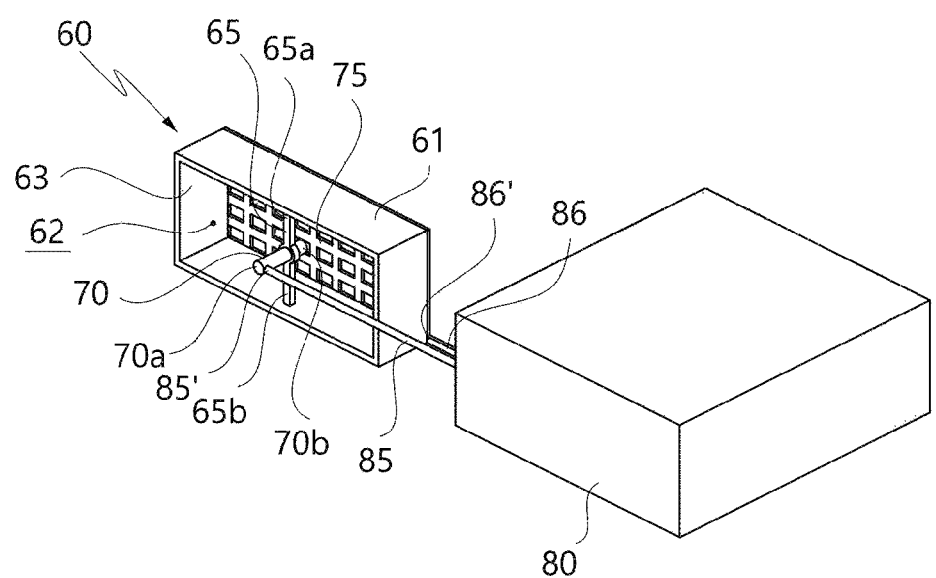
FIG. 7 is a perspective view illustrating a first embodiment of the ionic wind generator according to the present disclosure.
Figure 8:
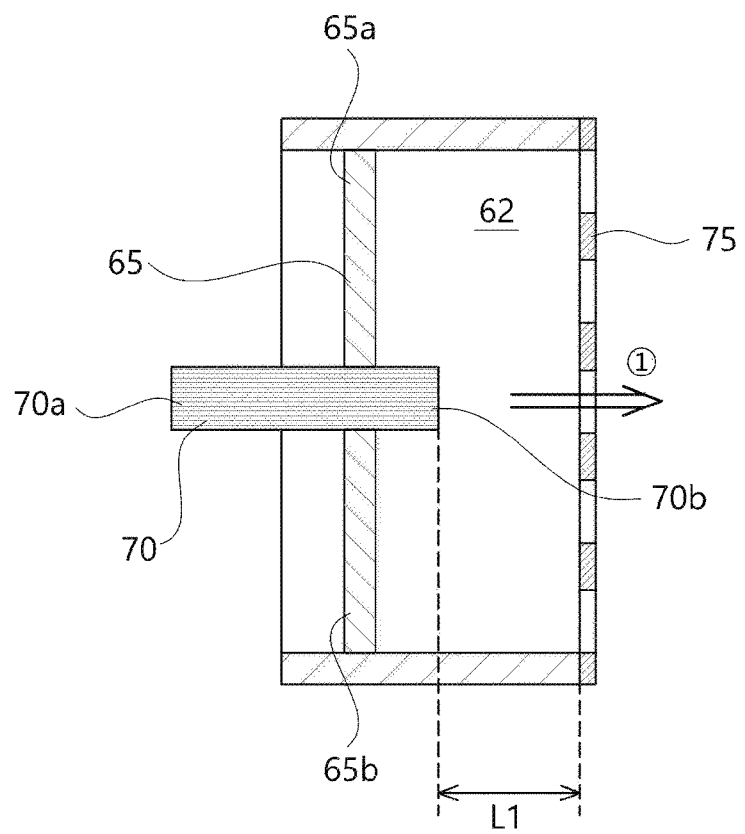
FIG. 8 is a side sectional view of configuration of the first embodiment illustrated in FIG. 7.

In FIGS. 6 to 8, the configuration of the ionic wind generator 50 is illustrated in detail. Referring to FIG. 7, the ionic wind generator 50 includes the module housing 60 mounted to the casing 10 or the circuit board 40. The module housing 60 constitutes the framework of the ionic wind generator 50 and is a kind of housing of an approximately hexagonal shape in the embodiment. The module housing 60 includes a housing body 61 of an insulating material such as synthetic resin. The module housing 60 has an installation space 62 having open opposite sides provided in a middle thereof, wherein the first electrode 70 is installed at an entrance of the installation space 62 and the second electrode 75 is installed at an exit of the installation space 62.

The installation space 62 has an approximately rectangular shape, and the entrance of the installation space faces the outside of the casing 10, and the exit thereof faces the inner space, that is, the heating element 45. The installation space 62 provides a space in which the first electrode 70 and the second electrode 75 can be installed, and further secures a separation distance of the first electrode 70 and the second electrode 75 from each other. More particularly, a width direction of the installation space 62, that is, the distance from the entrance to the exit allows the first electrode 70 and the second electrode 75 to be spaced apart from each other.

The first electrode 70 is installed in the installation space 62 of the module housing 60. As illustrated in FIG. 7, the first electrode 70 is installed at the entrance of the installation space 62 in forward and rearward directions, and a first end 70b of the first electrode protrudes to the exit of the module housing 60, that is, in a direction of the second electrode 75. In addition, a second end 70a protruding to an opposite side of the first end 70b may be electrically connected to the power module 80 by the connection wire 85. In the embodiment, the first electrode 70 is installed in a direction of the shortest distance toward the second electrode 75 in the installation space 62 but may be installed in an inclining direction toward the second electrode, or two or more first electrodes may be provided.

The first electrode 70 is configured as the carbon brush. More particularly, the first electrode 70 is configured to receive power from the power module 80 by being connected to the power module 80 to become the emitter electrode and to be the carbon brush including multiple carbon fibers. Accordingly, the carbon brush composed of multiple carbon fibers can obtain a larger ionization amount than a wire electrode or the needle electrode, and can obtain a faster ionic wind speed than a wire electrode or the needle electrode when the carbon brush and the wire electrode or the needle electrode have the same diameters. Particularly, the carbon brush has lower breakage and wear rates than the existing wire electrode or needle electrode, so the durability of the ionic wind generator 50 is improved.

Generally, when the emitter electrode and the collector electrode are positioned to be close to each other, wind speed becomes faster but an ozone generation amount is increased. However, the first electrode 70 of the present disclosure is configured as the carbon brush, which allows the ozone generation amount to be significantly decreased compared to the existing wire electrode. For reference, in the same condition of a diameter, a distance between electrodes, and an applied voltage, the emitter electrode of the wire electrode generates 1.5 times more ozone than the emitter electrode of the carbon brush.

Figure 12A:
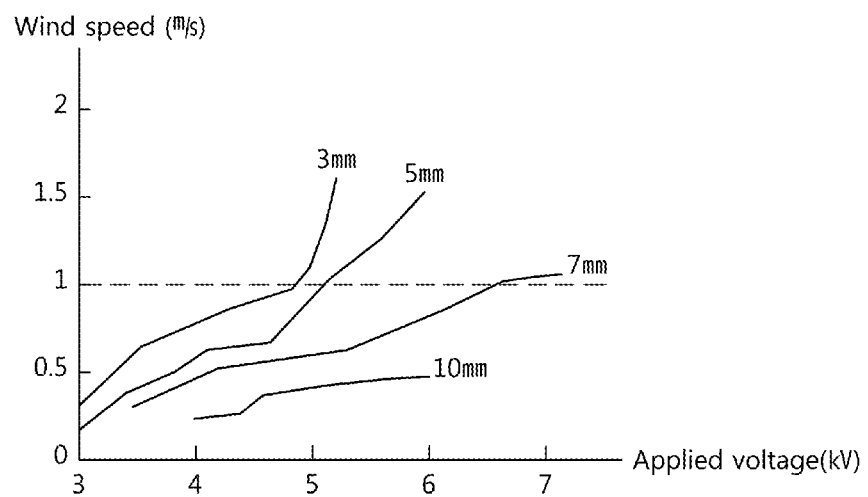
FIGS. 12A and 12B are graphs illustrating wind speeds and ozone generation amounts, respectively, according to a relative distance between a first electrode and a second electrode constituting the embodiments of the present disclosure and voltages applied thereto.
Figure 12B:
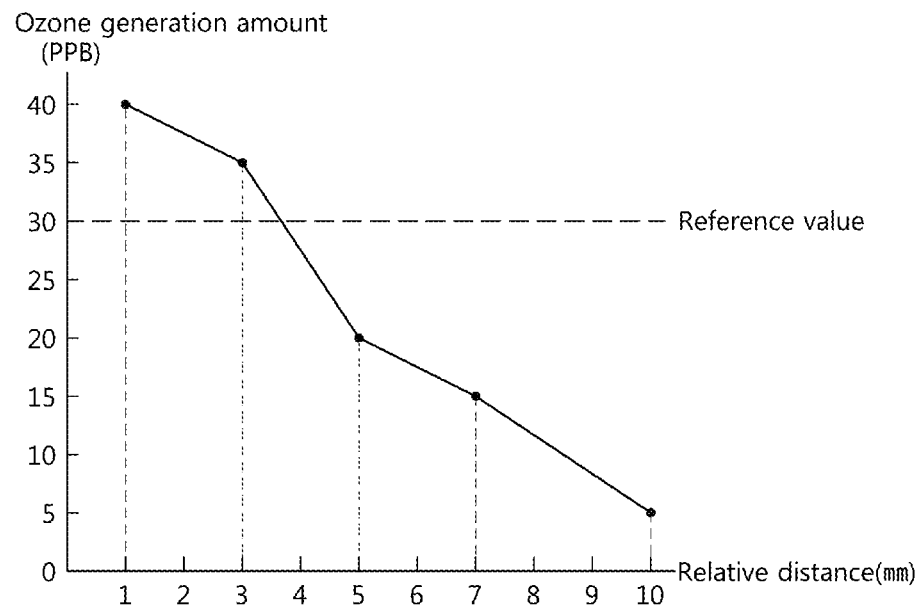

FIGS. 12A and 12B are graphs illustrating wind speeds and ozone generation amounts, respectively, according to a relative distance between the first electrode 70 and the second electrode 75 constituting the embodiments of the present disclosure and voltages applied thereto. Referring to FIG. 12A, as the applied voltage is increased, the wind speed is increased. Results measured when relative distances L1 (see FIG. 8) between the first electrode 70 and the second electrode 75 are 3 mm, 5 mm, 7 mm, and 10 mm are illustrated as a graph. Accordingly, as the applied voltage increases, the wind speed also tends to increase. However, when the relative distance L1 between the first electrode 70 and the second electrode 75 is 5 mm or less, the increase is relatively larger.

Meanwhile, FIG. 12B illustrates the ozone generation amount according to the relative distance L1 between the first electrode 70 and the second electrode 75. When the relative distance L1 between the first electrode 70 and the second electrode 75 is 4 mm or less, the ozone generation amount exceeds a predetermined reference value of 30 PPB. Accordingly, considering both the speed of the ionic wind and the ozone generation amount, the relative distance L1 between the first electrode 70 and the second electrode 75 is preferably 3 mm to 5 mm.

In addition, in the embodiment, the first electrode 70 has 10,000 to 15,000 carbon fibers, the diameter of the first electrode 70 being 1.5 mm to 3.5 mm. This is because the speed of the ionic wind is low when the diameter of the first electrode 70 is 1.5 mm or less, and the ozone generation amount exceeds 40 PPB for the same reason as mentioned above when the diameter of the first electrode 70 is 3.5 mm or more.

Referring to FIGS. 7 and 8 again, the first electrode 70 has the structure of a thin and long shape and the first end thereof is installed to face the second electrode 75. Furthermore, the first end 70b of the first electrode 70 faces the second electrode 75 such that the distance L1 between the first electrode 70 and the second electrode 75 becomes the shortest. Accordingly, the distance L1 between the first electrode 70 and the second electrode 75 is decreased, so a faster ionic wind speed can be obtained.

Accordingly, the first electrode 70 and the second electrode 75 are installed in the module housing 60. Particularly, the first electrode 70 is installed at an entrance of the installation space 62 of the module housing 60 and the second electrode 75 is installed at the exit of the installation space 62, so the ionic wind may flow in a direction of the exit from the entrance of the installation space 62, and the ionic wind passing the exit faces the circuit board 40 and the heating element 45. (see arrow ① of FIG. 8) In addition, an open outlet B is provided at a position corresponding to the opposite side of the inlet A relative to the heating element 45 in the casing 10. Accordingly, the ionic wind is introduced to the inlet A and then discharged through the outlet B.

The first electrode 70 may be installed at a side inner than the entrance of the installation space 62. Since the first electrode 70 receives power, the first electrode 70 may be installed at a position inside the installation space 62 for safety, but in the embodiment, a portion of the first electrode 70 protrudes to the outside of the installation space 62.

Figure 9:
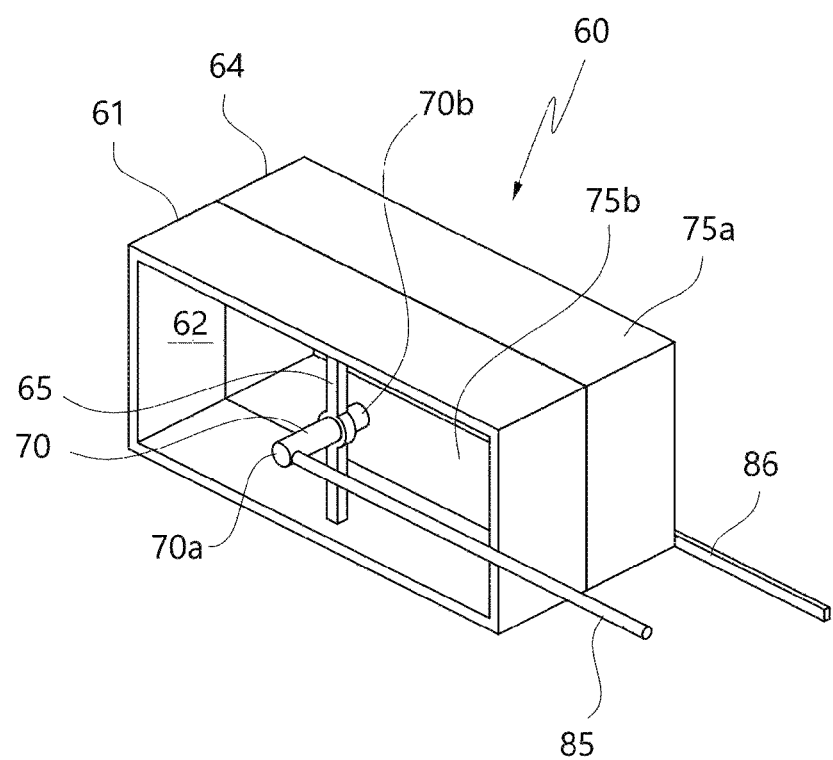
FIG. 9 is a perspective view illustrating a second embodiment of the ionic wind generator according to the present disclosure.

In addition, in the embodiment, the first electrode 70 is mounted to a mounting arm part 65 provided at the entrance of the module housing 60. Referring to FIG. 9, the mounting arm part 65 is made of an insulating material and is provided to cross opposite ends of the entrance of the module housing 60. That is, each of opposite ends 65a and 65b of the mounting arm part 65 is connected to the module housing 60. Alternatively, only any one end of the opposite ends 65a and 65b of the mounting arm part 65 may be connected to the module housing 60. When the first electrode 70 is mounted to the mounting arm part 65, the first end 70b of the first electrode 70 faces the second electrode 75, and the second end 70a positioned at the opposite side of the first end faces the outer side of the installation space 62.

Accordingly, the first electrode 70 may be movably mounted to the mounting arm part 65. More particularly, the first electrode 70 is fitted into a combination part positioned at a center of the mounting arm part 65 and is movable in forward and rearward directions instead of being completely fixed thereto. Accordingly, the first electrode 70 may advance to or withdraw from the second electrode 75, and the relative distance between the first end of the first electrode 70 and the second electrode 75 may be changed. In this case, the speed of the ionic wind may be easily adjusted according to the installation environment or products to which the ionic wind generator 50 is applied, and when the carbon brush wears out, the carbon brush may be moved outwards to restore performance thereof, which extends the life of the ionic wind generator 50.

Next, when the second electrode 75 is seen, the second electrode 75 is installed to be spaced apart from the first electrode 70 to the exit of the installation space 62, that is, to the inner space. The second electrode 75 is directly grounded through a ground wire 86 at the same time of being connected to the power module 80 or is grounded through the circuit board 40 to become the ground electrode. The second electrode 75 may be implemented in various structures. In the embodiment, the second electrode 75 has the structure of a metal mesh. Alternatively, the second electrode 75, which is a thin metal plate, may be installed on an inner surface 63 of the installation space 62 and may be modified variously.

Meanwhile, the ionic wind generator 50 may be directly mounted to the casing 10 without the module housing 60. For example, the first electrode 70 and the second electrode 75 may be mounted in the inlet A of the casing 10, or the first electrode 70 and the second electrode 75 may be mounted in the inner space.

Looking at a process in which the ionic wind flows with reference to FIG. 2, first, when a high voltage direct current is applied to the first electrode 70 by the power module 80, the first electrode 70 becomes the emitter electrode and the second electrode 75 becomes the collector electrode (the ground electrode), so that the ionic wind is generated. More particularly, ions generated in the first electrode 70 by corona discharge are moved from the emitter electrode (the first electrode 70) to the ground electrode (the second electrode 75) by an electric field between the electrodes, that is, by coulomb force. The ions moving in this manner move air molecules in the same direction (a direction of arrow ① of FIG. 2) via the collision with the air molecules, and the movements of the moving air molecules are joined together and finally generate a blowing force.

Accordingly, in the present disclosure, the first electrode 70, the second electrode 75, and the power module 80 constitute the ionic wind generator 50, wherein the ionic wind generator 50 generates the ionic wind and functions to cool the heating element 45 positioned in the second electrode 75. In the embodiment, the ionic wind generator 50 is installed to be adjacent to the heating element 45 and causes the ionic wind to flow to the inner space. For reference, the power module 80 may be regarded as a part of the ionic wind generator 50, and may also be regarded as a part of the circuit board 40.

The ionic wind uses the movements of ions during corona discharge. The ions generated by the discharge electrode are moved from the emitter electrode (the discharge electrode) to the collector electrode (the ground electrode) by an electric field between the electrodes, that is, by coulomb force. The ions moving in this manner move air molecules in the same direction via the collision with the air molecules, and the movements of the air molecules are joined together and are finally used as a blowing force.

Accordingly, the ionic wind generator 50 of the present disclosure can be applied to a structure installed in the narrow inner space S and being poor in heat dissipation in which the heating element 45 generating high temperature such as a communication module is provided and the heating element 45 is covered by the shield to block electromagnetic waves.

Meanwhile, the ionic wind exchanges heat with the heating element 45 and the circuit board 40 via convective heat transfer while passing the heating element 45 in the inner space. In this case, the upper surface 41 and the lower surface 42 of the circuit board 40 can exchange heat with the ionic wind. Accordingly, the surface area of a heating unit (the heating element and the circuit board) that exchanges heat with the ionic wind is increased and the convective heat transfer efficiency is improved.

The ionic wind having increased temperature after performing the heat exchanging exchanges heat even with the first heat sink 29 and the second heat sink 39. The first heat sink 29 and the second heat sink 39 have temperature increased while exchanging heat with the ionic wind having the increased temperature, but the surfaces thereof are exposed to the outside, so the first heat sink and the second heat sink can be cooled. Accordingly, the temperature of the inner space may be dissipated through the first heat sink 29 and the second heat sink 39 to the outside. (see directions of arrows ②  and ②' of FIG. 2)

In addition, the ionic wind having increased temperature after the ionic wind passing the heating element 45 exchanges heat with the heating element 45 is discharged through the outlet B of the casing 10 to the outside (see a direction of arrow ③ of FIG. 2). Since such a process is performed continuously, the heating element 45 can be cooled. Accordingly, the ionic wind generator 50 of the present disclosure cools the heating element 45 of the electronic device by generating the ionic wind, wherein the two means of the ionic wind generator 50 and the heat sink simultaneously cool the heating element 45, which increases the cooling efficiency and causes no noise and vibration compared to a cooling fan powered by a motor.

Particularly, in the present disclosure, the first electrode 70 is the carbon brush composed of multiple carbon fibers, so a relatively faster ionic wind speed can be obtained. Furthermore, the first electrode 70 of the present disclosure is configured as the carbon brush, so the ozone generation amount is significantly decreased compared to the existing wire electrode, which allows the distance L1 between the first electrode 70 and the second electrode 75 to be sufficiently short.

Consequently, (i) the heat of the heating element 45 and the circuit board 40 exchanges heat with the ionic wind introduced into the inner space so as to remove the heat, and (ii) the ionic wind transfers the inner heat to the first heat sink 29 and the second heat sink 39 and the heat is dissipated to the outside, so the heating element 45 and the circuit board 40 can be cooled.

Next, other embodiments of the present disclosure will be described with reference to FIGS. 9 to 11. For reference, the description of the same parts as in the above-described embodiments will be omitted. First, referring to FIG. 9, the second electrode 75b may be a metal plate provided on an inner surface 63 of the installation space 62 of the module housing 60. As illustrated in FIG. 9, the second electrode 75b is combined with an inner surface of an extension part 75a of the module housing 60 to have a thin plate structure. In the embodiment, the second electrode 75b is provided on each of upper and lower parts of the inner surface of the extension part 75a of the module housing 60. Alternatively, the second electrode 75b may be provided on all of four inner surfaces of the extension part 75a of the module housing 60. The extension part 75a may be regarded as a portion of the module housing 60. However, of course, the second electrode 75b may be installed on the inner surface 63 of the installation space 62, without the extension part 75a provided in the module housing 60.

Figure 10:
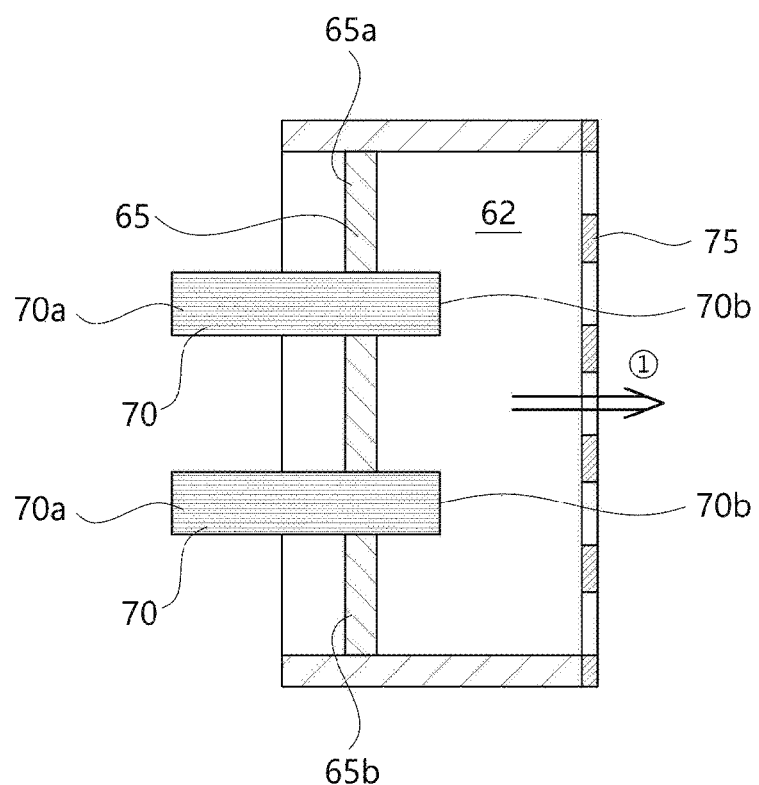
FIG. 10 is a side sectional view illustrating a third embodiment of the ionic wind generator according to the present disclosure.

In addition, as illustrated in FIG. 10, the first electrode 70 may be multiply provided in directions parallel to each other. In FIG. 10, a total of two first electrodes 70 are installed to be spaced apart from each other in upward and downward directions and to be parallel to each other. Accordingly, the speed of the ionic wind may flow to a wide section. Of course, alternatively, three or more first electrodes 70 may be installed or multiple first electrodes 70 may be arranged in left to right directions.

Figure 11:
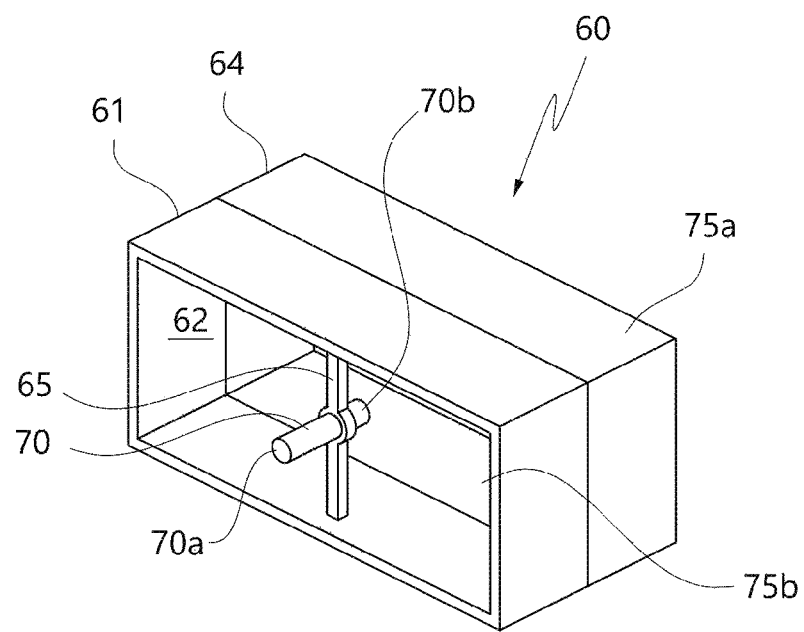
FIG. 11 is a perspective view illustrating a fourth embodiment of the ionic wind generator according to the present disclosure.

Meanwhile, referring to FIG. 11, the ionic wind generator 50 may be directly mounted to the circuit board 40 without the connection wire 85 and the ground wire 86. Accordingly, the first electrode 70 may be connected to the power module 80 by a pattern of the circuit board 40, and the second electrode 75 may be grounded at the same time of being connected to the power module 80 by the pattern of the circuit board 40. In this case, the mounting arm part 65 provided in the module housing 60 is made of a conductive material, and an end of the mounting arm part may be mounted to the circuit board 40, and a portion of the second electrode 75 may also be mounted to the circuit board 40 by protruding to the outside of the module housing 60.

In the above description, the present disclosure is not necessarily limited to these embodiments, although all elements constituting the embodiments according to the present disclosure are described as being combined or operating in combination. That is, within the scope of the present disclosure, all of the components may be selectively combined to operate in one or more. In addition, the terms "include", "constitute", or "having" described above mean that the corresponding component may be inherent unless otherwise stated. Accordingly, it should be construed that other components may be further included instead of being excluded. All terms, including technical and scientific terms, have the same meaning as commonly understood by ones of ordinary skills in the art to which the present disclosure belongs unless otherwise defined. Commonly used terms, such as those defined in a dictionary, should be construed as consistent with the contextual meaning of the related art and shall not be construed in an ideal or excessively formal sense unless explicitly defined in the present disclosure.

What is claimed is:

1. An ionic wind generator configured to generate an ionic wind for heat dissipation within a casing of an electronic device, comprising:
    a power module;
    at least one first electrode configured to receive power from the power module by being connected to the power module to function as an emitter electrode and comprising a carbon brush comprising multiple carbon fibers; and a second electrode spaced apart from the at least one first electrode and grounded and at the same time connected to the power module to function as a counter electrode, wherein the at least one first electrode and the second electrode are provided in a module housing, wherein the module housing is configured to be disposed on one side of the casing and a heating element is configured to be installed in a path through which the ionic wind generated by the at least one first electrode and the second electrode flows in an inner space of the casing, wherein the heating element is a circuit board provided in the inner space of the casing or a component mounted to the circuit board, wherein the module housing is provided adjacent to an inlet open at one side of the casing, and wherein an outlet is open at a position corresponding to an opposite side of the inlet relative to the heating element in the casing.

2. The ionic wind generator claim 1, wherein the at least one first electrode has a thin and elongated structure relative to the second electrode, and wherein a first end of the at least one first electrode is positioned to face the second electrode.

3. The ionic wind generator claim 1, wherein a first end of the at least one first electrode faces the second electrode at a shortest distance between the at least one first electrode and the second electrode.

4. The ionic wind generator claim 1, wherein the at least one first electrode is provided at an entrance of an installation space of the module housing and the second electrode is provided at an exit of the installation space such that the ionic wind flows to the exit of the installation space from the entrance thereof.

5. The ionic wind generator claim 4, wherein the second electrode is configured as a metal mesh provided at the exit of the module housing or a metal plate provided on an inner surface of the installation space of the module housing.

6. The ionic wind generator claim 4, wherein the at least one first electrode is mounted to a mounting arm provided at the entrance of the module housing, wherein when the at least one first electrode is mounted to the mounting arm, a first end of the at least one first electrode faces the second electrode and a second end of the at least one first electrode positioned at an opposite side of the first end faces an outside of the installation space.

7. The ionic wind generator claim 6, wherein the at least one first electrode is mounted to the mounting arm to move in a direction of the second electrode, so a relative distance between the first end of the at least one first electrode and the second electrode is changeable.

8. The ionic wind generator claim 7, wherein the mounting arm is provided to cross opposite ends of the entrance of the module housing.

9. The ionic wind generator claim 1, wherein the at least one first electrode comprises a plurality of first electrodes provided parallel to each other.

10. The ionic wind generator claim 1, wherein the at least one first electrode comprises 10,000 to 15,000 carbon fibers, a diameter of the at least one first electrode being 1.5 mm to 3.5 mm.

11. The ionic wind generator claim 1, wherein when a voltage applied to the at least one first electrode by the power module is 4 kV to 7 kV, a distance between the at least one first electrode and the second electrode is 3 mm to 5 mm.

12. An electronic device having a heat dissipation function, the electronic device comprising:
a heating element provided in a casing; and
an ionic wind generator provided in the casing to be adjacent to the heating element and causing an ionic wind to flow to an inner space in which the heating element is provided, wherein the ionic wind generator comprises:
at least one first electrode configured to receive power from a power module to function as an emitter electrode and comprising a carbon brush comprising multiple carbon fibers; and
a second electrode spaced apart from the at least one first electrode and grounded and at the same time connected to the power module to function as a counter electrode, wherein the at least one first electrode and the second electrode are provided in a module housing, wherein the heating element is a circuit board provided in the inner space of the casing or a component mounted to the circuit board, wherein the module housing is disposed adjacent to an inlet open at one side of the casing, and wherein an outlet is open at a position corresponding to an opposite side of the inlet relative to the heating element in the casing.

13. The electronic device of claim 12, wherein the at least one first electrode has a thin and elongated structure relative to the second electrode, and wherein a first end of the at least one first electrode is positioned to face the second electrode at a shortest distance between the at least one first electrode and the second electrode.

14. The electronic device of claim 12, wherein
the at least one first electrode is positioned at an entrance of an installation space of the module housing, and the second electrode is provided at an exit of the installation space of the module housing, wherein the ionic wind generated by the at least one first electrode flows in a direction of the exit of the installation space from the entrance thereof, wherein the at least one first electrode is mounted to a mounting arm provided at the entrance of the module housing, and wherein when the at least one first electrode is mounted to the mounting arm, a first end of the at least one first electrode faces the second electrode and a second end of the at least one first electrode positioned at an opposite side of the first end faces an outside of the installation space.

15. The electronic device of claim 14, wherein the at least one first electrode is mounted to the mounting arm to move in a direction of the second electrode such that a relative distance between the first end of the at least one first electrode and the second electrode is changeable.

16. The electronic device of claim 12, wherein a heat dissipation window is open at at least one side of an upper part and a lower part of the casing, and wherein a heat sink in the shape of a flat plate is provided in each heat dissipation window and extends parallel to the circuit board.

17. The electronic device of claim 16, wherein the ionic wind generator is provided at an edge of a side surface of the circuit board such that the ionic wind generated by the ionic wind generator flows to each of an upper surface and a lower surface of the circuit board.

18. The electronic device of claim 12, wherein the at least one first electrode comprises 10,000 to 15,000 carbon fibers, a diameter of the at least one first electrode being 1.5 mm to 3.5 mm, and wherein when a voltage applied to the at least one first electrode by the power module is 4 kV to 7 kV, a distance between the at least one first electrode and the second electrode is 3 mm to 5 mm.

19. The electronic device of claim 12, wherein the ionic wind generator is directly mounted to the circuit board such that the at least one first electrode and the second electrode are electrically connected to the power module by a circuit pattern of the circuit board.

\* \* \* \* \*